United States Patent [19]

Nagaraj

[11] Patent Number: 5,784,016
[45] Date of Patent: Jul. 21, 1998

[54] SELF-CALIBRATION TECHNIQUE FOR PIPE LINE A/D CONVERTERS

[75] Inventor: K. Nagaraj, Summerville, N.J.

[73] Assignee: Texas Instruments Incorporated, Dallas, Tex.

[21] Appl. No.: 742,963

[22] Filed: Nov. 1, 1996

Related U.S. Application Data

[63] Continuation of Ser. No. 433,297, May 2, 1995, abandoned.

[51] Int. Cl.⁶ .................................................. H03M 1/10
[52] U.S. Cl. .................... 341/120; 341/162; 341/172; 341/161; 341/167
[58] Field of Search .................... 341/118, 120, 341/121, 156, 161, 162, 166, 167, 172

[56] References Cited

U.S. PATENT DOCUMENTS

| 5,394,148 | 2/1995 | Matsuura et al. | 341/162 |
| 5,416,485 | 5/1995 | Lee | 341/172 |
| 5,440,305 | 8/1995 | Gignore et al. | 341/120 |

*Primary Examiner*—Jeffrey A. Gaffin
*Assistant Examiner*—Jason H. Vick
*Attorney, Agent, or Firm*—Richard L. Donaldson; William B. Kempler

[57] ABSTRACT

A new self calibration technique for pipe line A/D converters is presented. It consists of calibration by correcting the reference voltage to each stage by means of a tunable MOSFET attenuator. This simplifies the calibration circuit in each stage and shifts most of the calibration task to a hardware that is shared by all the stages.

7 Claims, 2 Drawing Sheets

SELF-CALIBRATION TECHNIQUE FOR PIPE LINE A/D CONVERTERS

This application is a Continuation of application Ser. No. 08/33,297, filed May 2, 1995 now abandoned.

FIELD OF THE INVENTION

This invention relates generally to the field of pipe line A/D converters and more particularly to the calibration of A/D converters by correcting the reference voltage to each stage by means of a tunable MOSFET attenuator.

BACKGROUND OF THE INVENTION

A pipe line algorithmic A/D converter that encodes one bit per stage, is very attractive for high speed applications. The main reason for the high speed capability is that each stage in the pipe line has to have gain of just 2. This enables better utilization of the bandwidth of the amplifiers. Also, by using a two level decision circuit and digital error correction (rather than a single level circuit), the precision requirement on the decisions can be dramatically relaxed.(See "A 10-b 20-Msamples/s analog-to-digital converter", IEEE Journal of solid State Circuits, Vol. 27, pp. 351–358, March 1992, by S. H. Lewis et al.) This allows the decisions to be made even before the amplifier is settled out, thereby further increasing operating speed. For the purpose of our discussion, one stage of a typical switched-capacitor pipe line A/D converter is shown in FIG. 1. It basically consists of an analog arithmetic unit that is capable of multiplying the input signal by a factor of 2, as well as adding to it or subtracting from it a reference voltage $V_R$. The precision of the arithmetic operation is limited by the finite gain of the amplifier. Taking these into account, the input output relationship for the stage shown in FIG. 1 can be expressed as $$V_{RES}(n) = \left(1 + \frac{e_n}{2}\right) 2V_{RES}(n-1) \pm (1+e_n)V_R$$

where $e_n$ is the net error in the multiplication factor. This equation applies for a single level decision circuit. A similar equation applies for a two level decision circuit, except that the reference voltage added to the residue is $\pm(1+e_n)V_r$ or 0, depending on the decision from the previous stage.

In order to achieve a precision of better than 10 bits, the above error needs to be cancelled by some means. Ratio-independent techniques that need multiple clock cycles are not suitable for high speed applications.(See "A ratio independent algorithmic analog-to-digital conversion technique", IEEE Journal of solid State Circuits, Vol. SC-19, pp. 1138–1143, December 1984, by P. W. Li, et al.) The appropriate approach is to use a self-calibration technique that consists of initially measuring and storing the error factors and then applying a correction during every conversion cycle. Previously proposed self-calibration techniques include analog as well as digital approaches. In the analog approach presented in a paper entitled "A 13-b 2.5 MHz self-calibrated pipelined A/D converter in a 3 um process", IEEE Journal of Solid State Circuits, Vol. SC-26, pp. 628–636, April 1991 by Y. M. lin et al., a programmable trim capacitor array is placed across either $C_1$ or $C_2$. Calibration is achieved by appropriately setting the trim capacitor by means of an initial measurement of the mismatch error. The trim network typically consists of a fixed capacitive attenuator followed by a programmable capacitor array. In a pipeline architecture, such a method results in a significant increase in area, because there are several stages that have to be calibrated. Also, there is additional capacitive loading on the amplifiers. In the digital calibration technique presented in the paper entitled "A 12-b 600 Ks/s digitally self-calibrated pipelined algorithmic ADC", IEEE Journal of Solid State Circuits, Vol. SC-29, pp. 509–515, April 1994, by H-S Lee, the error factors for each stage are initially measured, digitized and used for computing correction factors for each bit to be calibrated. These correction factors are digitally added to the result at the end of each conversion cycle. This method needs several addition operations to be performed at the end of each cycle. This would need either extra conversion time or extra power dissipation.

SUMMARY OF THE INVENTION

A method of calibrating a pipe line A/D converter comprises correcting a reference voltage to each stage of the pipe line A/D converter by means of a tunable MOSFET attenuator. The tuning voltages for the different stages of the pipe line A/D converter are derived in a master tuning circuit, wherein a single master tuning circuit sequentially serves all stages of the pipe line A/D converter, and wherein the single master tuning circuit consists of a capacitive multiplying DAC that is driven by a digital calibration word for the particular stage being refreshed. The output of the multiplying DAC is compared with the calibrated reference from the stage and the tuning voltage is adjusted to the particular stage until they are equal.

DESCRIPTION OF THE PREFERRED EMBODIMENT

Calibration by Reference Trimming

Instead of canceling ratio errors by introducing a trim function in the signal path, an alternative approach is to distort the reference voltage to each stage such that the output of the stage is free from linearity error. Such an approach has two advantages; 1) Some or most of the trim circuits can be shared by all stages and 2) There is no extra capacitive loading on the signal amplifiers.

Considering the first stage, we can write the input output relation as $$V_{RES}(1) = \left(1 + \frac{e1}{2}\right) 2V_{in} \pm (1+e_1)V_R$$

where $V_R(1)$ is the reference voltage to the first stage.
If we set $$V_R(1) = \left(1 - \frac{e_1}{2}\right) V_R$$

the above equation gets modified as follows (neglecting $$e\frac{2}{1}).$$

$$V_{RES}(1) = \left(1 + \frac{e_1}{2}\right)(2V_{in} \pm V_R)$$

This new residue is free from any linearity error. Similarly for the second stage, we have $$V_{RES}(2) = \left(1 + \frac{e_2}{2}\right)2V_{RES}(1) \pm (1 + e_2)V_R$$

Setting $$V_R(2) = \left(1 - \frac{e_1}{2}\right)\left(1 - \frac{e_2}{2}\right)V_R,$$

we get $$V_{RES}(2) = \left(1 + \frac{e_1}{2}\right)\left(1 + \frac{e_2}{2}\right)[2(2V_{in} \pm V_R) + V_R]$$

Again, this residue is free from linearity error. Proceeding on the same lines it can be shown that we need $$V_R(3) = \left(1 + \frac{e_1}{2}\right)\left(1 + \frac{e_2}{2}\right)\left(1 - \frac{e_3}{2}\right)V_R$$

$$V_R(4) = \left(1 + \frac{e_1}{2}\right)\left(1 + \frac{e_2}{2}\right)\left(1 + \frac{e_3}{2}\right)\left(1 - \frac{e_4}{2}\right)V_R$$

and so on.

The above technique is analogous to the reference recirculation approach presented by C. C. Shih and P. R. Gray, entitled "Reference refreshing cyclic analog-to-digital and digital-to-analog converters", IEEE Journal of solid State Circuits, Vol. SC-21, pp. 544–554, August 1986, that has been applied to at recirculating converter. In a high speed pipe line converter however, there is no time available for reference recirculation and the calibration has to be done by inserting trim circuits in the reference path. An area efficient way of achieving this is described in the next section.

Description of the Trim Technique of The Preferred Embodiment

Figure 2:
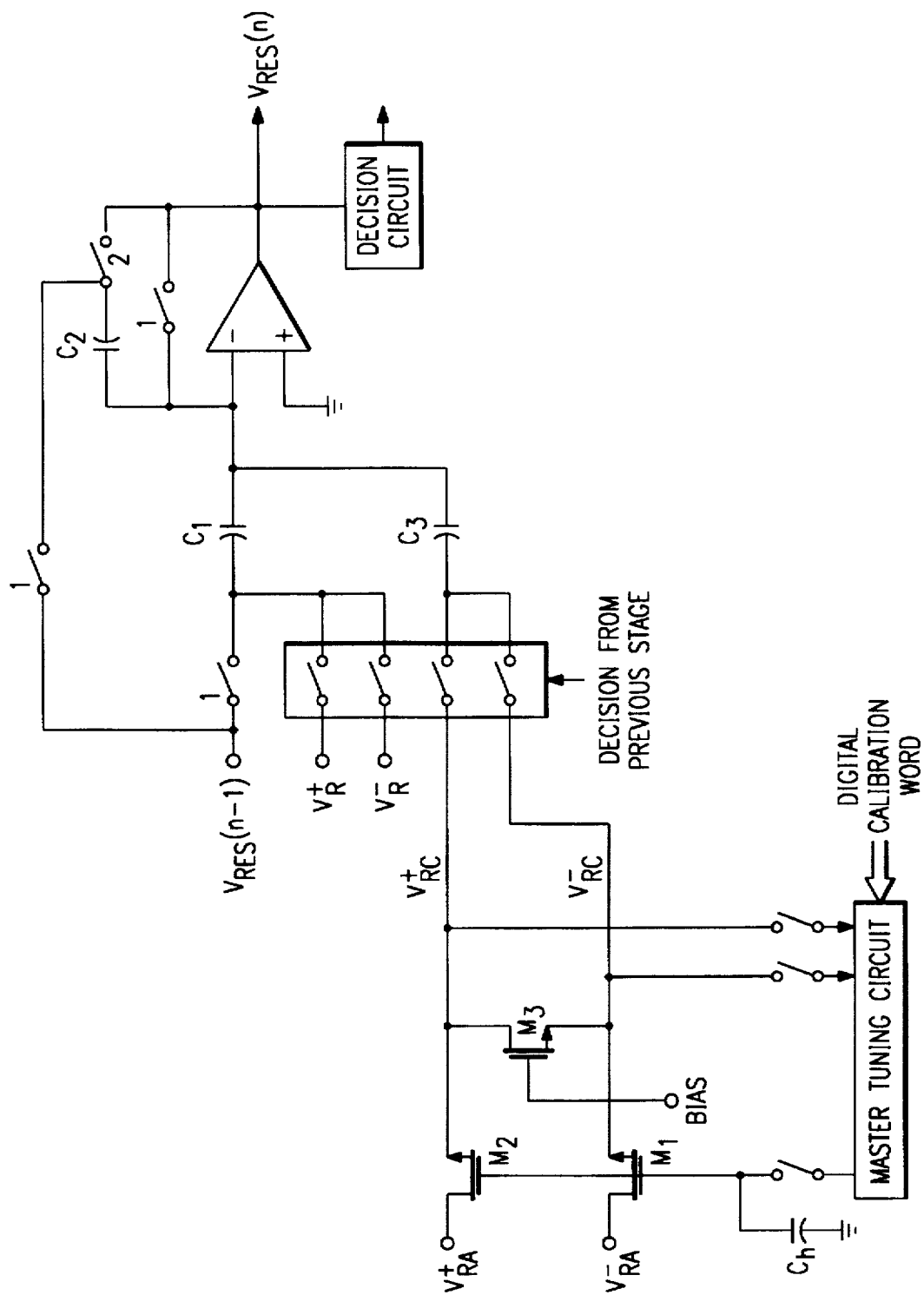
FIG. 2 is a schematic diagram of the proposed trim circuit of the preferred embodiment.

FIG. 2 shows one stage of the pipe line with the proposed trim circuit. Capacitors $C_1$ and $C_2$ constitute the main arithmetic unit. Capacitor $C_3$ (which can be much smaller than the main capacitors) provides a small correction to the effective reference voltage to the stage. $V_{RA}+V_{RA}$—are derived from the main reference voltage $V_R+$ and $V_R-$ by means of a fixed attenuator that is common to all stages (not shown in FIG. 2). This is further attenuated by the tunable attenuator comprising transistors $M_1$, $M_2$ and $M_3$, to generate a calibrated reference voltage for the stage.

The tuning voltages to the different stages are derived in a master tuning circuit by using the appropriate digital calibration words. A single master tuning circuit sequentially serves all the stages. The tuning voltage is held on a hold capacitor ($C_h$ in FIG. 2) until the stage is refreshed again by the master. The minimum required refreshing rate is determined by leakage currents.

The digital calibration words for the different stages are initially determined and memorized. This is accomplished by analog measurements of the error factors $e_1$, $e_2$, etc. The measurement can be done independently for each stage and the following stages in the pipe line are used to digitize the measured error factor. To overcome the effect of offsets, each measurement is done in two steps as described in the paper described above entitled "A 12-b 600 Ks/s digitally self-calibrated pipeline algorithmic ADC" by H. S. Lee. From these error factors, the net additive correction terms for the reference voltages are calculated and stored in the calibration memory.

Figure 1:
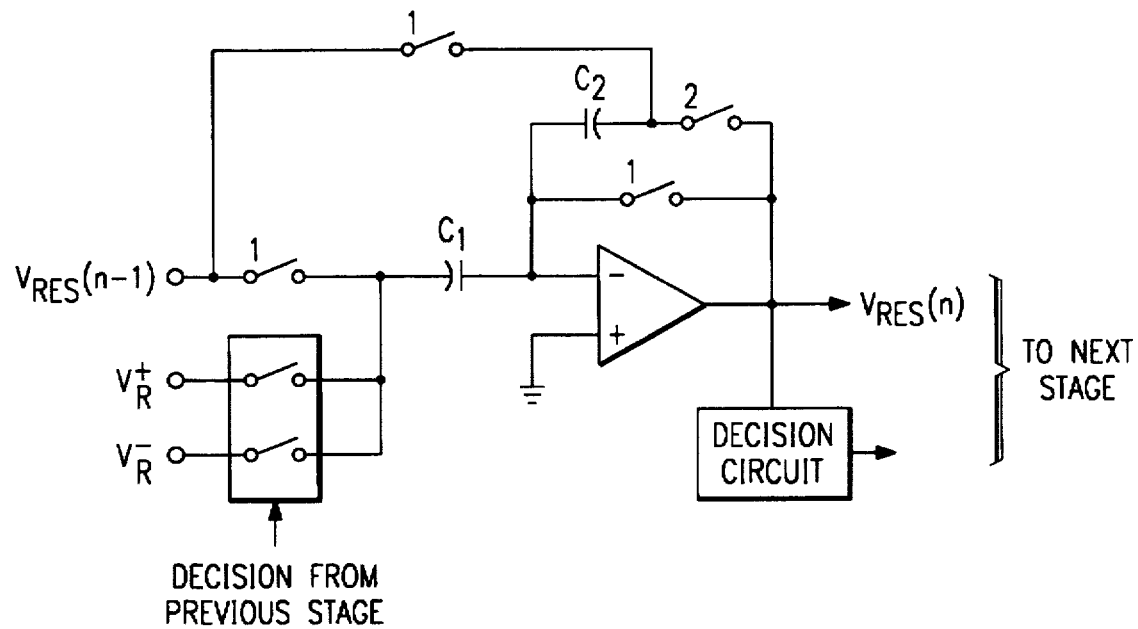
FIG. 1 is a schematic diagram of one stage of a pipe line A/D converter of the prior art.
Figure 3:
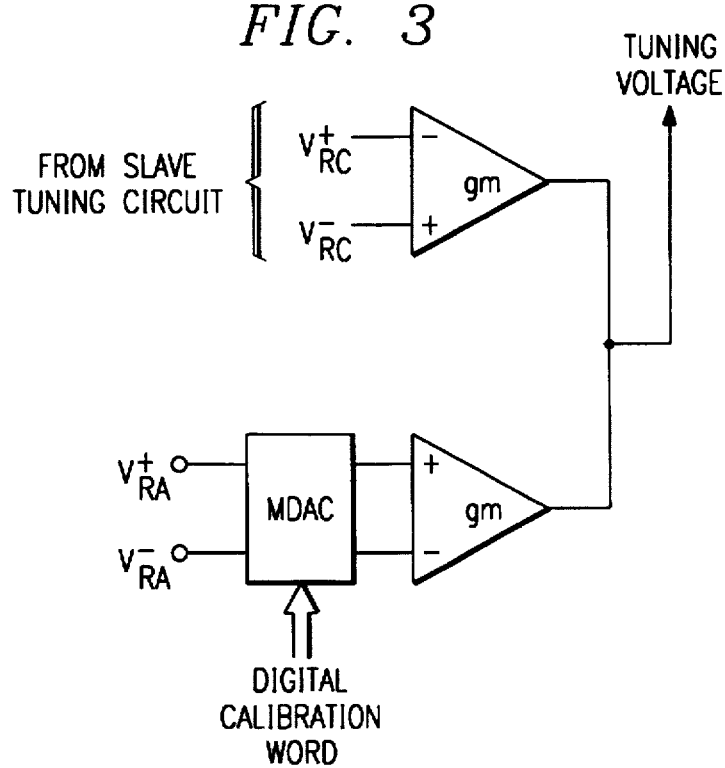
FIG. 3 is a schematic diagram of the master tuning circuit of the preferred embodiment.

The block schematic of the master tuning circuit is shown in FIG. 3. It consists of a capacitive multiplying DAC (MDAC) that is driven by the digital calibration word for the particular stage being refreshed. The output of the MDAC is compared with the calibrated reference from the stage, and the timing voltage to the stage is adjusted until the two are equal.

It is seen from the above that much of the circuitry involved in the trimming process is now shared by all stages. The trim circuitry in the individual stages is very simple and would occupy very little area.

In practice it should be possible to dispense with the calibration beyond a certain stage in the pipe line, because the component matching requirement progressively decreases (by a factor of two) from one stage to the next. However, with the above scheme, there is a continuous accumulation of gain error which can cause a problem if we abruptly dispense with the calibration in the middle of the pipeline. To illustrate this we consider a 13 bit converter where the first 5 stages are calibrated. Assuming that all these stages have an error of $e_{max}$, the net gain error after the 5 stages is equal to $2.5e_{max}$. Assuming an error factor of 0.25 percent, the gain error will be 6.25 percent. This is clearly too large to be able to perform a 8 bit converter on the residue. A simple solution to this problem is to forward the calibrated reference voltage of stage 5 to the next few stages also, (this does not need any extra circuitry). This eliminates the effect of the accumulated gain error. Beyond a certain stage, even this can be dispensed with, because the resolution required from the remainder of the pipe line would be so coarse that even the accumulated gain errors do not matter.

Another important factor to be considered is the charge injection from the switch into the hold capacitor $C_h$ at the end of a refresh cycle. This causes a change in the effective value of the trim. This is a manageable problem because of two factors; First, the amount by which the tuning voltage is updated during a refreshing operation is very small. Thus a small switch size can be used; Second, the resolution needed from the trim circuit is only about 6 bits. If needed, the situation can be improved further by adding two auxiliary transistors, one between $$V\frac{+}{RA} \text{ and } V\frac{-}{RA}$$

and the other between $$V\frac{-}{RA} \text{ and } V\frac{+}{RC}.$$

The gates of these cross-coupled transistors are connected to a second hold capacitor which is identical to $C_h$. This second capacitor is refreshed with a constant bias voltage every time the main hold capacitor is refreshed by the master tuning circuit. The two auxiliary transistors cancel the feed through error in the main transistors.

Even with the measures mentioned above, there will be a small momentary change in the tuning voltage during a refresh cycle. If the refreshing is done concurrently with the conversions, this will cause an error in that particular conversion cycle. Although the magnitude of this error can be kept within an LSB, the 'fixed pattern' nature of the noise may not be acceptable in some applications. When using a two level decision circuit, this problem can be avoided by doing the refreshing for a stage only if the decision from the previous stage were such that the reference value to be subtracted from the residue is zero. Thus, the actual value of the reference during that particular cycle is inconsequential. To be able to do this, we allocate several successive clock cycles for the refreshing of each stage. The master tuning circuit waits until it detects the desired decision from the previous stage.

I claim:

1. A method of calibrating a pipe line A/D converter which comprises the steps of:

correcting a reference voltage to each stage of the pipe line A/D converter by means of a tunable MOSFET attenuator;

deriving tuning voltages for the different stages of the pipe line A/D converter in a master tuning circuit, wherein a single master tuning circuit sequentially serves all stages of the pipe line A/D converter, and wherein said single master tuning circuit consists of a capacitive multiplying DAC that is driven by a digital calibration word for the particular stage being refreshed;

comparing the output of the multiplying DAC with the calibrated reference from the stage; and adjusting the tuning voltage to the particular stage until they are equal.

2. The method of claim 1 wherein said adjusting step comprises:

generating a tuning voltage in said master tuning circuit;

applying said tuning voltage to a pair of MOS transistors to generate said adjusted reference voltage from a fixed reference voltage.

3. A method of calibrating a pipe line A/D converter which comprises the steps of:

correcting a reference voltage to a plurality of stages of the pipe line A/D converter by means of a tunable MOSFET attenuator;

deriving tuning voltages for the different stages of the pipe line A/D converter in a master tuning circuit, wherein a single master tuning circuit sequentially serves all stages of the pipe line AID converter, and wherein said single master tuning circuit consists of a capacitive multiplying DAC that is driven by a digital calibration word for the particular stage being refreshed;

comparing the output of the multiplying DAC with the calibrated reference from the stage; and adjusting the tuning voltage to the particular stage until they are equal.

4. The method of claim 3 wherein said adjusting step comprises:

generating a tuning voltage in said master tuning circuit;

applying said tuning voltage to a pair of MOS transistors to generate said adjusted reference voltage from a fixed reference voltage.

5. A pipe line A/D converter comprising:

a predetermined number of pipe line A/D converter stages;

a single master tuning circuit coupled to a plurality of said pipe line AID converter stages, said single master tuning circuit deriving tuning voltages for said plurality of pipe line A/D converter stages and consisting of a capacitive multiplying DAC that is driven by a digital calibration word for each particular stage of said plurality being refreshed;

a comparator comparing an output of said multiplying DAC with a calibrated reference from the stage; and a tunable MOSFET attenuator for generating a calibrated reference voltage for each stage.

6. The apparatus of claim 5 wherein said single master tuning circuit is coupled to all stages of said pipe line A/D converter.

7. The apparatus of claim 5 wherein said MOSFET attenuator comprises a pair of MOSFET transistors each being coupled to a separate fixed reference voltage and to said tuning voltage for generating said calibrated reference voltage.

* * * * *